United States Patent [19]

Jayne et al.

[11] 4,060,300

[45] Nov. 29, 1977

[54] LONGITUDINALLY ACTUATED ZERO FORCE CONNECTOR

[75] Inventors: Max L. Jayne, North Warren; Paul R. Natale, Warren, both of Pa.

[73] Assignee: GTE Sylvania Incorporated, Stamford, Conn.

[21] Appl. No.: 764,278

[22] Filed: Jan. 31, 1977

[51] Int. Cl.$^2$ .............................................. H05K 1/07

[52] U.S. Cl. ........................... 339/74 R; 339/176 MP

[58] Field of Search ................ 339/74 R, 74 L, 75 M, 339/75 MP, 176 M, 176 MP

[56] References Cited

U.S. PATENT DOCUMENTS

| | | | |
|---|---|---|---|
| 3,665,370 | 5/1972 | Hartmann | 339/176 MP |
| 3,784,954 | 1/1974 | Grimm | 339/75 MP |
| 3,818,419 | 6/1974 | Crane | 339/74 R |
| 4,021,091 | 5/1977 | Anhalt | 339/176 MP |

OTHER PUBLICATIONS

Gustafson, Zero Insertion Force Connector, IBM Technical Disclosure Bulletin, vol. 3, No. 7, 12/1970, p. 2048.

Colletti, Twin-Contact Connector, IBM Technical Disclosure Bulletin, vol. 14, No. 9, p. 2597, 2/1972.

*Primary Examiner*—Roy Lake
*Assistant Examiner*—Mark S. Bicks
*Attorney, Agent, or Firm*—Norman J. O'Malley; John C. Fox; Donald R. Castle

[57] ABSTRACT

An edge connector for a printed circuit board including two actuator plates comprising cam followers and two contact holders comprising opposing cam surfaces. Movement of the actuator plates along the longitudinal axis of the connector forces the opposing contact holders apart when the cam followers engage the high point of an adjacent cam surface and allows the opposing contact holders to move towards each other when the cam followers engage the low point of an adjacent cam surface.

10 Claims, 2 Drawing Figures

LONGITUDINALLY ACTUATED ZERO FORCE CONNECTOR

BACKGROUND OF THE INVENTION

1. Field of the Invention

The present invention relates to an electrical connector and, more particularly, to a longitudinally actuated zero force electrical connector in which the longitudinal movement of an actuator plate forces opposing contact holders and contacts engaging such holder apart when a cam follower which forms a part of each actuator plate engages the high point of a corresponding cam which forms a part of each contact holder. Similarly, such longitudinal movement allows the opposing contact holders and contacts to move toward each other when the cam followers engage the low point of the cams.

2. Description of Prior Art

Prior art attempts have been made to reduce or eliminate the contact between the terminals of a printed circuit board and opposing electrical contacts when the board is inserted into a connector of the type used to interconnect the connector's resilient contact members with the board terminals. For example, in U.S. Pat. No. 3,710,303 a connector is provided having means to shift the contact elements out of the insertion path of the circuit board as a result of the engagement, during insertion, between the circuit board and cam projections which form part of the connector. In the structure described, such cam projections extend further inward from the channel walls of the housing of the connector than do the contacts. When a circuit board is inserted into the channel the board engages the projections and displaces the projections away from the longitudinal axis of the channel. Due to the interrelationship between the projections and the contacts, the displacement of the projections causes a corresponding displacement of the contacts such that the contacts are displaced out of the path of the board. When the board is completely inserted into the connector, the cam projections enter recesses in the board. Such movement of the projections into the recesses causes corresponding movement of the contacts into engagement with the surface of the board, thereby electrically connecting the contacts to the board terminals. Although such devices reduce the contact between the board terminals and the connector contacts, the physical engagement between the board and the cam projections may require that more force than is desired be exerted to insert or remove the board in some applications.

In U.S. Pat. No. 3,478,301 an electrical connector is provided in which only after partial insertion of the printed circuit board is engagement of the connector contacts with the board contact terminals effected. In this structure, an elongated hollow body which forms the connector receptacle includes therein cam means which are actuated automatically by the insertion of a printed circuit board to displace resilient contacts into engagement with corresponding circuit board terminals. In operation, even though the circuit board has been partially inserted into the connector receptacle, there in no engagement with the contacts. After partial insertion, continued insertion causes the printed circuit board to actuate the cam means such that the board engages levers or lugs thereby pivotting cam lobes which bring resilient contact fingers into engagement with circuit board terminals. By moving the circuit board further into the receptacle toward the final position of the board, the contacts effect a wiping action against the terminals until the contacts are locked in resilient engagement with corresponding terminals. Although such devices eliminate the contact between the board terminals and the connector contacts as the board is being initially inserted into the connector, the physical engagement between the board terminals and connector contacts as the board is moved further into the connector may require that more force than is desired be exerted to complete the insertion and lock the contacts in engagement with the terminals. Similarly, such engagement may require relatively more force than is desired to remove the board from the connector and may cause undesirable wear of the contacts and board terminals.

Efforts have been made to provide a zero force connector in which the engagement of the connector contacts with the printed circuit board terminals is not effected until after the board has been inserted in the connector to the extent desired. For example, in U.S. Pat. No. 3,475,717 a zero force connector is provided having actuator plates which are slidably disposed within the connector housing to engage and disengage the resilient contacts per se. When the actuator plate engages such contacts, it flexes the contacts into engagement with the printed circuit board terminals. When the actuator plate is disengaged from such contacts, the inherent resiliency of the contacts causes the contacts to be biased away from the printed circuit board terminals. Although such a device may reduce the force required to insert a terminal board into a connector, inherent in the operation of such connectors is undesirable engagement between the actuator plates and the connector contacts.

Finally, in U.S. Pat. No. 3,526,896, a cam actuated connector is provided which includes an actuating cam, the rotation of which causes a bearing surface to engage an actuating surface to thereby move an actuating housing in a longitudinal direction. The housing comprises ramp sections which slide, as a result of such longitudinal movement, relative to ramp portions of actuator spacers to cause the actuator spacers to move inwardly or outwardly relative to the longitudinal axis of the housing. Such movement of the spacers causes corresponding movement of the contacts which engage the terminals of the printed circuit board. Although such a device may reduce the force required to insert a terminal board into a connector, the operation of this device requires a mechanism whereby rotational motion must be translated into longitudinal motion.

In addition to all of the foregoing, some prior art connectors have not proved to be totally satisfactory in that they have not been constructed to hold up under continuous use. Other prior art connectors have included complex structures which require that the connector be larger than desired.

It is therefore one of the objects of the present invention to provide a connector which will permit substantial reduction, or elimination, of the engagement between the terminals of a printed circuit board and opposing electrical contacts of the connector except for such time as the board is inserted into the connector to the extent desired.

Another object of the present invention is to provide a connector the use of which requires a minimum amount of force to insert a printed circuit board therein, or remove it therefrom.

A further object of the present invention is to provide a connector wherein the physical contact between the connector contacts and board terminals is substantially reduced except for such time as the board is inserted into the connector to the extent desired.

Yet a further object of the present invention is to provide a connector wherein any undesirable wear of the board terminals or connector contacts is substantially reduced.

Yet another object of the present invention is to provide a connector which does not require the translation of rotational motion into longitudinal motion during operation.

A further object of the present invention is to provide a connector which may be readily miniaturized.

Yet a further object of the present invention is to provide a connector which is simple in construction and durable even when subjected to continued use.

These and other objects will become apparent from the detailed discussion which follows and from the accompanying drawings.

SUMMARY OF THE INVENTION

Generally, the electrical connector of the present invention comprises a hollow support member, the side walls of which each include at least one lug which protrudes from the exterior surface of each wall. Two opposing contact holders are positioned within the hollow support member and extend along the support members' longitudinal axis. The opposing surfaces of the contact holders include opposing cam surfaces each of which has a high point and a low point. At least one resilient electrical contact engages each of the contact holders and urges the opposing surfaces toward each other. Two actuator plates are slidingly affixed to the exterior surfaces of the side walls of the support member as a result of the extension of the side wall lugs into apertures which extend into the actuator plates. In order to allow the actuator plates to slide relative to the support member, the length of the apertures is greater than the length of the lugs measured along the longitudinal axis of the support member. Each actuator plate comprises at least one cam follower which extends into the support member and engages an associated cam surface of one of the opposing contact holders.

In operation, by sliding the actuator plates along the longitudinal axis of the support member, a contact holder and contacts affixed thereto are urged away from a corresponding opposing contact holder and associated contacts by a pivotal movement as the cam followers of each actuator plate engage the high point of its associated cam surface. The connector is designed such that the distance between opposing contacts is greater than the thickness of the printed circuit board as each cam follower engages the high point of its associated cam surface. Accordingly, the printed circuit board can be inserted into the connector without any appreciable frictional engagement between the two. Furthermore, such insertion can be either vertically (from above), or horizontally (from the side). After the board has been inserted into the connector, the actuator plates are similarly slid along the longitudinal axis, and a contact holder and contacts affixed thereto are pivotally urged toward a corresponding opposing contact holder and associated contacts as the cam follower of each actuator plate engages the low point of its associated cam surface. Such movement causes the contacts to electrically and physically engage the terminals of the board.

BRIEF DESCRIPTION OF THE DRAWINGS

In the drawings wherein like reference characters denote corresponding parts throughout the several views.

DESCRIPTION OF THE PREFERRED EMBODIMENTS

Figure 1:
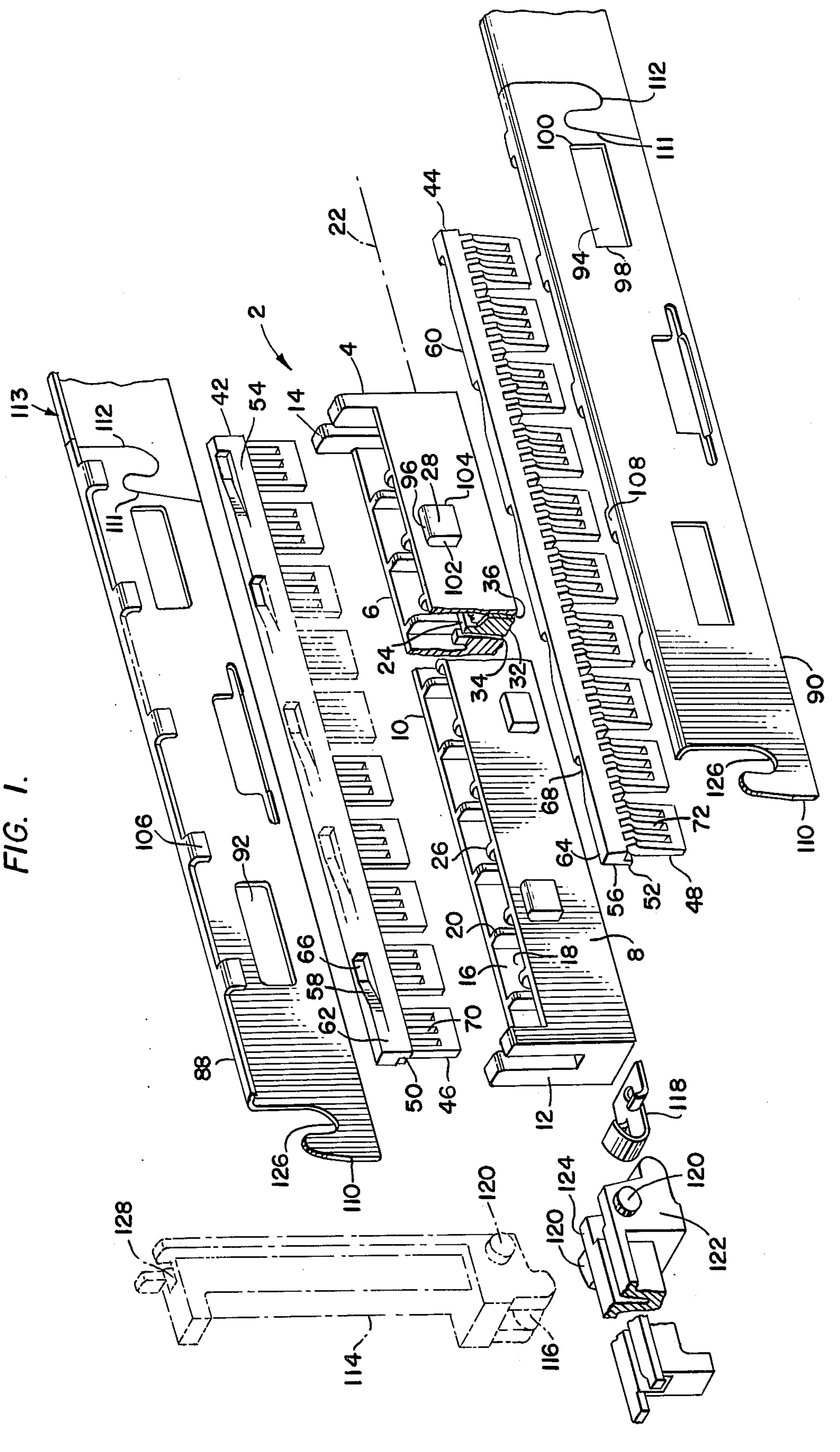
FIG. 1 is an exploded view of one embodiment of the connector of the present invention.
Figure 2:
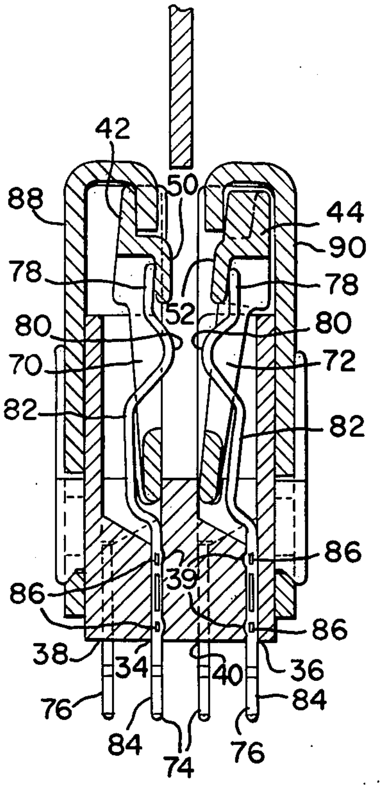
FIG. 2 is a sectional view of the embodiment of the connector of FIG. 1 and depicts the contact appearing on the left as being in the forward position relative to the circuit board to be inserted into the connector and the contact appearing on the right as being in the retracted position relative to the circuit board to be inserted into the connector.

FIG. 1 depicts an exploded view of one embodiment of the longitudinally actuated connector of the present invention. The connector 2 comprises a hollow support member 4, the hollow portion 6 of which is formed by side walls 8 and 10 connected to end walls 12 and 14. The connection of the side walls to the end walls may be inherent in the structure as a result of a manufacturing process such as, for example, a molding process during which all of the walls are rendered integral with each other. Alternatively, the end and side walls may be individually produced and subsequently affixed to each other. In the preferred embodiment the hollow portion 6 comprises opposing chambers 16 and 18. Chambers 16 are formed by interior walls 20 which extend generally perpendicular to the longitudinal axis 22 of support member 4, and interior flange 24 which extends along said longitudinal axis. Similarly, chambers 18 are formed by interior walls 26 and flange 24. The side walls 8 and 10 also extend along the longitudinal axis 22 of support member 4. Lugs 28 and 30 (not shown) protrude from the exterior surface of side walls 8 and 10, respectively. The bottom 32 of support member 4 includes four rows of apertures which extend therethrough. As depicted in FIG. 2, in the preferred embodiment the rows are staggered such that apertures 34 and 36 are offset in the longitudinal direction relative to apertures 38 and 40. In the preferred embodiment there are a plurality of apertures 34 and 38 which extend through the base 32 into each chamber 16 and a plurality of apertures 36 and 40 which extend through the base 32 into each chamber 18.

Opposing contact holders 42 and 44 extend along said longitudinal axis and include projections 46 and 48 which may be inserted into corresponding chambers 16 and 18. Contact holders 42 and 44 each also include lips 50 and 52 extending along said longitudinal axis. The opposing surfaces 54 and 56 of contact holders 42 and 44 comprise opposing cam surfaces 58 and 60 having opposing high points 62 and 64 and opposing low points 66 and 68. Each projection 46 and 48 comprises a plurality of apertures 70 and 72 which extend therethrough.

Resilient electrical contacts 74 and 76 are provided, each of which comprises a tab 78, a contact point 80 which extends towards said longitudinal axis, a concave portion 82 which extends away from said longitudinal axis, and an end portion 84. Contacts 74 and 76 extend through apertures 70 and 72 in contact holders 42 and 44 respectively, such that contact holders 42 and 44 lies between concave portions 83 and said longitudinal axis.

Tabs 78 are grasped by lips 50 and 52, contact points 80 extend through apertures 70 and 72 towards said longitudinal axis, and end portion 84 extends through apertures 34 and 36, or 38 and 40 in the bottom 32 of the support member 4. Each contact 74 and 76 also includes protrusions 86 which facilitate affixing the contacts 74 and 76 to the support member 4.

Actuator plates 88 and 90 are provided which include apertures 92 and 94 which are in alignment with lugs 30 (not shown) and 28. The length of the apertures is greater than the length of the lugs measured along the longitudinal axis 22. Lugs 28 and 30 include end portions 96 and 98 (not shown) which project in such a manner that when the lugs are inserted in the apertures of the actuator plates, the actuator plates may be snapped upon the lugs so that the actuator plates cannot be readily removed from the support member and yet may be slid along the longitudinal axis until either end 98 or 100 of an aperture 94 engages the adjacent end 102 or 104, respectively, of an associated lug. Actuator plates 88 and 90 also include cam followers 106 and 108. When the actuator plates are snapped onto the exterior surfaces of support member 4 the cam followers 106 and 108 extend into the support member and engage the associated cam surfaces 58 and 60. In this manner, the actuator plates are slidingly affixed to the support member by means of the lugs extending into the apertures in the plates such that movement of one or both of the actuator plates along the longitudinal axis 22 forces the opposing contact holders 42 and 44 apart when the cam followers engage the cam high points 62 and 64 and allows such opposing contact holders to move towards each other when the cam followers engage the cam low points 66 and 68.

In operation, the actuator plates are moved along the longitudinal axis 22 until the cam followers engage the high points of their associated cams at which time the lips 50 and 52 bear against their associated contact tabs 78 to cause the opposing contacts to pivot away from each other in such a manner that the distance between the opposing contact points 80 of alternately opposing contacts 74 and 76 is such that a printed circuit board can be inserted into the connector without engaging the contacts. When the board is inserted to the extent desired, the actuator plates are again moved along the longitudinal axis 22 until the cam followers engage the low points of their associated cams at which time the lips 50 and 52 release the pressure exerted against their associated contact tabs 78 to allow the opposing contacts to pivot toward each other in such a manner that the opposing contacts points 80 of alternately opposing contacts 74 and 76 physically and electrically bear against the board terminals. The movement of the contacts toward the circuit board results from the inherent resiliency of the contacts.

Although not necessary, in the preferred embodiment actuator plates 88 and 90 include hooks or fingers 110 and 112 positioned at the ends thereof which may be affixed to similar fingers 111 which are part of any adjacent connectors 113 which may be present. In such an embodiment, movement of actuator plates 88 and 90 causes corresponding movement of the adjacent actuator plate affixed thereto by means of fingers 111 and 112. To facilitate the movement of several actuator plates lying in tandem along the longitudinal axis and affixed one to the other, a pivoting arm 114 may be provided which pivots about a pin 116 which is pivotally affixed to the end of the connector 2 means of a channel member 118 which is attached to the end of the connector. The arm 114 is also provided with a pin 120 which extends from sides 122 and 124 thereof. Pin 120 meshes with the mating portion 126 of the hooks or fingers 110 of the actuator plates at the end of the series of tandemly aligned actuator plates. In operation, the actuator plates can be moved along the longitudinal axis 22 as described above by pivotting the arm 114 about pin 116 such that pin 120 bears against the mating portions 126. In viewing FIG. 1, when the arm 114 is moved to the position designated by the solid lines, the actuator plates 88 and 90 are moved to the left. When the arm 114 is pivoted back to the position designated by the broken lines, the actuator plates 88 and 90 are moved to the right. The same is true regarding any actuator plates affixed to plates 88 and 90 as described above. Preferably, the contacts are at the position conducive for insertion of the printed circuit board when the arm 114 is in the position represented by the solid line. This is desirable so that the channel 128, which extends the entire length of the arm 114, can be used to receive the bottom edge of the circuit board to thereby properly guide the board into the connector 4.

The embodiment which has been described herein is but one of several which utilize this invention and is set forth here by way of illustration but not of limitation. It is apparent that many other embodiments which will be readily apparent to those skilled in the art may be made without departing materially from the spirit and scope of this invention.

We claim:

1. A longitudinally actuated connector comprising:

a hollow support member comprising two longitudinally extending side walls, each having at least one lug which protrudes from the exterior surface thereof;

at least two opposing contact holders positioned within said support member and comprising opposing surfaces which include opposing cam surfaces having at least one high point and at least one low point;

at least one resilient electrical contact engaging each of said holders to form a pair of opposing contacts; and, at least two actuator plates having apertures therein through which said lugs extend to movably affix said plates to the exterior surfaces of said support member each of said plates including at least one cam follower which extends into said support member and engages one of said cam surfaces such that movement of said plates which causes said cam followers to engage said high points forces said opposing contacts apart and movement of said plates which causes said cam followers to engage said low points allows said opposing contacts to move towards each other.

2. The device of claim 1 wherein said support member comprises a plurality of chambers and said contact holders include a plurality of projections which extend into said chambers.

3. The device of claim 2 wherein each of said projections comprise a plurality of apertures through which said contacts extend, said opposing surfaces of each of said opposing contact holders comprise a lip, and each of said contacts comprise a tab which engages said lip.

4. A longitudinally actuated connector comprising:

a hollow support member having two side walls which extend along the longitudinal axis of said member and being connected by two end walls, each of said side walls including at least one lug which protrudes from the exterior surface thereof;

at least two opposing contact holders positioned within said support member and extending along said longitudinal axis, the opposing surfaces of said holders including opposing cam surfaces having high points and low points;

at least one resilient electrical contact engaging each of said holders, said contacts urging said opposing surfaces toward each other; and, at least two actuator plates slidingly affixed to the exterior surfaces of said support member, each of said plates including at least one cam follower which extends into said support member and engages one of said cam surfaces, each of said actuator plates including at least one aperture therein in alignment with at least one of said lugs, the length of said apertures being greater than the length of said lugs measured along said longitudinal axis, said actuator plates slidingly affixed to said support member by means of said lugs extending into said aperture such that movement of said actuator plates along said longitudinal axis forces said opposing contact holders and contacts engaging said holders apart by pivotal movement of the contact holders when said cam follower engages said high point and allows said opposing contact holders and contacts engaging said holders to move towards each other by pivotal movement of the contact holders in a reverse direction when said cam follower engages said low point.

5. The device of claim 4 wherein said support member comprises a plurality of chambers and said contact holders include a plurality of projections which extend into said chambers.

6. The device of claim 5 wherein each of said projections comprise a plurality of apertures through which said contacts extend.

7. The device of claim 6 wherein said opposing surfaces of each of said opposing contact holders comprise a lip which extends along said longitudinal axis, and each of said contacts comprise a tab which engages said lip.

8. The device of claim 4 wherein said actuator plates comprise means for connecting said plates to adjacent actuator plates lying in tandem along said longitudinal axis.

9. The device of claim 8 wherein said connector comprises an arm which is pivotally connected thereto such that the pivoting of said arm causes said longitudinal movement.

10. The device of claim 9 wherein said arm comprises a first pin which is pivotally connected to said support member and a second pin which is connected to said actuator plates.

* * * * *

UNITED STATES PATENT AND TRADEMARK OFFICE
CERTIFICATE OF CORRECTION

PATENT NO. : 4,060,300

DATED : November 29, 1977

INVENTOR(S) : Max L. Jayne and Paul R. Natale

It is certified that error appears in the above-identified patent and that said Letters Patent are hereby corrected as shown below:

| Column Number | Line Number | | |
|---|---|---|---|
| 2 | 36 | 3,526,896 | 3,526,869 |
| 4 | 68 | 83 | 82 |

Signed and Sealed this

*Fifteenth* Day of *August 1978*

[SEAL]

*Attest:*

RUTH C. MASON
*Attesting Officer*

DONALD W. BANNER
*Commissioner of Patents and Trademarks*